United States Patent [19]
Yutori et al.

[11] Patent Number: 5,151,653
[45] Date of Patent: Sep. 29, 1992

[54] INSPECTION PROBE HAVING THIN METAL WIRES WITH SELF RESILIENCY

[75] Inventors: Toshiaki Yutori, Takasago; Yutaka Kanetsuki, Akashi, both of Japan

[73] Assignee: Kabushiki Kaisha Kobe Seiko Sho, Kobe, Japan

[21] Appl. No.: 666,806

[22] Filed: Mar. 8, 1991

[30] Foreign Application Priority Data

Mar. 8, 1990 [JP] Japan .................................. 2-57445

[51] Int. Cl.$^5$ ............................................. G01R 31/02
[52] U.S. Cl. ................................ 324/158 P; 324/72.5; 324/158 F
[58] Field of Search ............... 324/158 F, 158 P, 72.5; 439/482, 824

[56] References Cited

U.S. PATENT DOCUMENTS

| | | | |
|---|---|---|---|
| 3,731,191 | 5/1973 | Bullard et al. | 324/158 P |
| 4,980,638 | 12/1990 | Dermon et al. | 324/158 P |
| 5,015,947 | 5/1991 | Chism | 324/158 P |

FOREIGN PATENT DOCUMENTS

| | | |
|---|---|---|
| 0157835 | 12/1982 | Fed. Rep. of Germany ... 324/158 P |
| 0182756 | 7/1989 | Japan ................................. 324/158 P |

OTHER PUBLICATIONS

Lipschutz et al.; "Buckling Wire Probe Assembly"; IBM Technical Disclosure Bulletin, vol. 15, No. 10, Mar. 1973.

*Primary Examiner*—Vinh Nguyen
*Attorney, Agent, or Firm*—Oblon, Spivak, McClelland, Maier & Neustadt

[57] ABSTRACT

An inspection probe which allows a plurality of such inspection probes to be arranged at a remarkably reduced pitch. The inspection probe comprises a very thin metal wire having a diameter of 120 μm or less and so shaped as to have self resiliency, and a plated noble metal layer formed on a surface of the very thin wire. A probe pin head for the inspection of an electronic circuit board is constructed employing a plurality of such inspection probes. The inspection probes are secured to or embedded in a base made of a resin material. A process of producing the probe pin head is also disclosed.

4 Claims, 3 Drawing Sheets

INSPECTION PROBE HAVING THIN METAL WIRES WITH SELF RESILIENCY

BACKGROUND OF THE INVENTION

1. Field of the Invention

This invention relates to an inspection probe (pin probe) for use with an apparatus for inspecting conduction of conductors formed in a pattern, for example, on a liquid crystal substrate or semiconductor substrate, and more particularly to an inspection probe which is suitable for use with a probe pin head for the inspection of conduction of conductors which are formed in a high density on such a substrate.

2. Description of the Prior Art

A liquid crystal substrate which makes use of the characteristic of liquid crystal that the light transmittance and reflectance thereof are varied when a suitable voltage is applied thereacross is adopted, for example, in a liquid crystal projecting apparatus for projecting a picture image on a screen. Various product inspections are performed in a procedure of production of such liquid crystal substrates. An exemplary one of conventional conduction inspecting apparatus which perform such product inspections is shown in FIGS. 7 and 8. The conventional conduction inspecting apparatus shown includes a large number of pin probes 32 mounted parallelly in a predetermined spaced relationship from each other on a base 31. When the conduction inspecting apparatus is used, the pin probes 32 are contacted with end portions of conductors 36 formed in a lattice-like pattern on a liquid crystal substrate 35 to inspect electric conduction of the conductors 36. Here, if the pin probes 32 are projected over different distances from the base 31, then it is impossible for them to contact simultaneously and uniformly with all of the conductors 36. To avoid this, each of the pin probes 32 of the conventional conduction inspecting apparatus is formed in such a structure that a body 32a thereof is disposed for advancing and retracting movement in a case 37 and is supported resiliently by a coil spring 38 so that the probe body 32a may be provided with resiliency or normally urged in a direction to be projected from the base 31.

By the way, in the field of liquid crystal substrates adopted for liquid crystal projecting apparatus mentioned hereinabove, increase of the number of picture elements has been proceeded and is being proceeded in order to cope with achievement of a high picture quality, and in recent years, liquid crystal substrates which have 100 to 200 thousand picture elements or up to 300 thousand picture elements have been developed successfully. It is thus forecast that liquid crystal substrates having 800 thousand to 3 million picture elements will be demanded in the near future. Then, the pitch of conductors on a liquid crystal substrate is decreased as such increase of the number of picture elements proceeds. Accordingly, in order to cope with achievement of such high density of conductors, it is necessary to decrease the pitch of pin probes and the diameter of pins of such pin probes.

Further, also in semiconductor logic devices such as integrated circuits, the pitch of conductors is decreased to 50 $\mu$m or less or even to 25 $\mu$m or less, and in order to cope with such decrease of the pitch of conductors, the diameter of probe pins is naturally demanded to be smaller than 50 $\mu$m.

However, such conventional pin probe as described above has a problem that there is a limitation in decrease of the pitch and decrease of the diameter due to structure of them and they cannot cope with the demand described above. In particular, since the conventional pin probe 32 is constituted such that the probe body 32a is accommodated in the case 37 and is supported by the coil spring 38 so that it may have suitable resiliency, the pin probe 32 requires a spacing which is actually occupied by the case 37 in which the coil spring 38 is accommodated, and accordingly, a spacing much greater than a spacing the pin probe 32 actually occupies is required for the pin probe 32. Consequently, there is a base and a limitation in reduction of the pitch of such pin probes, and the pitch is considered to be limited to 300 $\mu$m or so.

SUMMARY OF THE INVENTION

It is an object of the present invention to provide an inspection probe which allows a plurality of such inspection probes to be arranged at a remarkably reduced pitch.

In order to attain the object, according to the present invention, there is provided an inspection probe which comprises a very thin metal wire having a diameter of 120 $\mu$m or less and so shaped as to have self resiliency, and a plated noble metal layer formed on a surface of the very thin wire.

The very thin metal wire may be selected from a low carbon two-phase structure steel wire, a piano wire, a stainless steel wire or a BeCu wire. Normally, an inspection probe is required to have such characteristics that the strength and rigidity against a contacting pressure under which it is contacted with an object for the inspection are high and that the durability against continuous use for a long period of time is also high, and the metal wires listed above are optimum in order to satisfy those characteristics while the diameter is smaller than 120 $\mu$m.

The shape having self resiliency signifies herein a shape with which, when the inspection probe is contacted with a conductor, the wire can be resiliently deformed in the contacting direction to such a degree that, where a plurality of such inspection probes are provided, for example, in a probe pin head, a possible difference in amounts over which the inspection probes are projected from the probe pin head can be absorbed. Such shape having self resiliency can be realized, for example, by bending a very thin metal wire itself so that the force when it is contacted with an object may act upon the metal wire with a component of force acting in a direction perpendicular to the axis of the metal wire.

With the inspection probe, since the very thin metal wire is so shaped as to have self resiliency, the diameter of the very thin metal wire itself is minimized, and consequently, reduction of the pitch of such inspection probes where a plurality of such inspection probes are arranged, for example, on a probe pin head can be achieved. While a probe body of the conventional inspection probe described hereinabove is accommodated in a case and is resiliently supported by a coil spring and consequently there is a limitation in reduction of the pitch of such inspection probes where a plurality of such inspection probes are arranged, the present invention eliminates the problem of such limitation by forming the probe body (very thin metal wire) itself so as to have resiliency.

Further, the very thin metal wire is plated with noble metal in order that the contact resistance thereof may be reduced to improve the stability in inspection performance of the inspection probe. Such noble metal may be selected from Au, Pt, Ag and so forth.

With the inspection probe, since the very thin metal wire having a diameter of 120 μm or less is shaped so as to have self resiliency, such a coil spring as in the conventional inspection probe described hereinabove can be eliminated, and such inspection probes can be arranged parallelly in a spaced relationship by a very small distance from each other, which allows coping with an increasing high density of objects for the inspection. Accordingly, for example, a probe pin head in which a plurality of such inspection probes are disposed can cope with an increase in number of picture elements on a liquid crystal substrate or the like, and a possible dispersion of amounts over which such inspection probes are projected from the probe pin head can be absorbed.

Preferably, the very thin metal wire is formed from a low carbon two-phase structure steel wire having a tensile strength of 300 kg/mm$^2$.

The low carbon two-phase structure steel wire is adopted for the very thin metal wire in order to assure high strength, high rigidity, high durability and high working feasibility and further reduce the pitch of such inspection probes as described above. In particular, such low carbon two-phase structure steel wire is superior in strength, rigidity and durability and besides is superior also in working feasibility in working such wire to reduce the diameter to 120 μm or less, and accordingly, the diameter of the low carbon two-phase structure steel wire can be reduced comparing with a piano wire and so forth mentioned hereinabove. Further, since the very thin metal wire is so shaped as to have self resiliency, it is necessary for a strand thereof to be superior in shaping feasibility to such shape, and in order to reduce the pitch described above, it is further necessary that the very thin metal wire has low plane distortion in such a shaped condition as described above. Incidentally, the plane distortion is a criterion in accordance with which it is judged whether shaped articles make a same plane, and in case the plane distortion is great, to whichever degree the diameter of the strand is reduced, the pitch described above cannot be reduced. A low carbon two-phase structure steel wire is superior in such characteristics, and from those points, such low carbon two-phase structure steel wire is adopted.

Such low carbon two-phase structure steel wire is produced by compulsorily working a wire stock consisting of 0.01 to 0.50% by weight of C, less than 3.0% by weight of Si, less than 5.0% by weight of Mn and the remaining part of Fe and inevitable impurities and having a wire diameter of 3.0 to 6.0 mm to obtain a wire of a diameter of 10 to 100 μm by primary thermal treatment, primary cold wire drawing, secondary heat treatment and secondary cold wire drawing. The very thin metal wire has fiber-like fine metal structures wherein working cells produced by the compulsory working mentioned above are arranged to extend in one direction like fibers. Besides, the size and the fiber to fiber distance of the very thin metal wire are 5 to 100 Å and 50 to 1,000 Å, respectively, and the tensile strength of the very thin metal wire ranges from 300 to 600 kgf/mm$^2$.

The low carbon two-phase structure steel wire described above was completed finding out the following facts after the inventors had continued energetic investigations of metal structures which can assure such characteristics as described above. In particular, a wire stock having a composite metal structure wherein a phase formed by low-temperature transformation of a Fe-C-Si-Mn iron-base alloy consisting of acicular martensite or bainite or a mixed structure of them is dispersed uniformly in a ferrite phase is superior in compulsory working feasibility, and if a wire stock having such metal structure is employed, then a very thin wire having a diameter of 100 μm or less can be obtained readily with certainty by cold wire drawing. Then, if such steel wire stock is compulsorily worked to a working distortion higher than 4 by cold wire drawing, then a uniform fiber-like fine metal structure wherein composite structures (two-phase structures) in which a ferrite phase and a phase formed by low-temperature transformation are combined with each other extend in one direction is formed, and it has been found out that a very thin wire having such metal structure is remarkably improved in tensile strength to 300 to 600 kgf/mm$^2$ and besides is tough against bending, shearing and torsional deformation and is superior also in tenacity.

The inventors of the present invention have continued further investigations of a reinforcing mechanism of the metal structure from the point of view that the metal structure is a main factor of improving the tensile strength and tenacity, and as a result, it has been found out that, with a metal structure having such a very high strength as described above, the fiber to fiber distance described above is 50 to 5,000 Å and fiber-like composite structures described above are constituted from very fine cells of 5 to 100 Å.

Such low carbon two-phase structure steel wire is produced in the following manner.

First, a wire stock consisting of 0.01 to 0.5% by weight of C, less than 3.0% by weight of Si, less than 5.0% by weight of Mn and the remaining part of Fe and inevitable impurities and having a diameter of 3.5 mm or less is heated to a temperature within the range from 700° C. to 1,100° C. and then cooled (such heating and cooling may be performed by a plurality of times) to produce a wire stock having a composite structure wherein a phase formed by low-temperature transformation and consisting of martensite or bainite or a mixed structure of them in which residual austenite may partially remain is dispersed uniformly by 15 to 75% by volume in a ferrite phase. It is to be noted that such producing process is disclosed in Japanese Patent Laid-Open Application No. 62-20824.

Subsequently, the composite structure wire stock obtained in this manner is compulsorily worked to a working distortion of higher than 4, preferably higher than 5, by cold wire drawing to combine the ferrite phase and the phase formed by low-temperature transformation to form fine fiber-like structures extending continuously in one direction as a metal structure. By increasing the working degree in this manner, the fiber-like structures become finer and the fiber to fiber distance is decreased. Finally, fiber-like fine metal structures wherein the size of cells produced by the working and the fiber to fiber distance range from 5 to 100 Å and from 50 to 1,000 Å, respectively, as described above. It is to be noted that, with a thin wire obtained by alternative wire drawing wherein the working distortion is lower than 4, the fiber-like structures remain at an intermediate stage of development thereof and are incomplete, and accordingly, also the strength thereof is low.

With the inspection probe, since a low carbon two-phase structure steel wire is adopted for the very thin metal wire, a very thin metal wire having a diameter ranging from 120 to 15 μm by suitably selecting a diameter and a degree of working a wire stock. Besides, since such two-phase structure steel wire has a very high strength at a tensile strength of 300 to 600 kg/mm² as described hereinabove in connection with the reinforcing mechanism, where it is employed for an inspection probe, the inspection probe is improved in strength, rigidity and durability and hence can assure requirements for an inspection probe. Further, the working feasibility of the very thin metal wire upon bending is improved, and consequently, it is easy to assure the shape of the very thin metal wire which has such self resiliency as described above. In addition, possible plane distortion of the very thin metal wire upon bending is reduced, and as a result, decrease of the pitch described above can be further promoted while possible interference of the very thin metal wire with an adjacent very thin metal wire can be eliminated.

Preferably, a plated Ni coating layer is formed as a foundation for the plated noble metal layer on the surface of the very thin metal wire, and the coating layer has working distortion caused by plastic working.

The plated Ni coating layer is formed as a foundation on the very thin metal wire in order to suppress activity of a strand of the metal wire and improve provision of a self-lubricating property and a corrosion resistance to such strand upon working or shaping of the strand.

If steel wire is made thin to a diameter 120 μm or less, then the ratio of a surface area to a volume of the wire is increased remarkably, and consequently, the activity of the surface of the very thin wire becomes extraordinarily high so that the wire may be broken by friction thereof with a dies when it is worked to a thin wire. On the other hand, since Ni has a very low activity, the activity of the very thin wire itself can be suppressed by coating Ni on a surface of a strand of the wire. Further, by coating Ni, the working feasibility of the very thin wire upon bending is increased, and a self-lubricating performance by which the shaping feasibility upon working can be improved is obtained. Further, a corrosion resistance for preventing occurrence of corrosion is provided to the strand.

It is to be noted that, as such coating method of Ni described above, any conventional method which is employed popularly such as a wet plating method such as electroplating or hot dipping or a dry plating method such as PCD, CVD or sputtering can be employed. Naturally, Ni plating mentioned here involves not only pure Ni but also any alloy of Ni with a suitable metal such as Cu, Zn or Al or some other metal which does not have a bad influence on such necessary characteristics as described above. Further, as for the coating amount of Ni on the very thin metal wire, if the amount is smaller than 1 g per 1 kg of the very fine wire, then it is difficult for the coating of Ni to exhibit coating effects such as an anticorrosion effect, or on the other hand if the amount exceeds 100 g, improvement in coating effect cannot be anticipated, but the coating is so thick that a minor undesirable demerit such as powdering upon working takes place. Accordingly, it is suitable to put the amount within the range of 1 to 100 g per 1 kg of the very thin wire.

Here, it is preferable to provide a working distortion by plastic working to the plated Ni coating layer.

A plated Ni coating layer produced by mere plating has a porous condition wherein it has a great number of pinholes, and hydrogen produced at such plating step is occluded into the plated Ni coating layer or else, air remains in the porosities of the plated Ni coating layer. Then, it is considered that the thus occluded hydrogen or the remaining air has a bad influence on the quality of the plated Ni coating layer and hence of the inspection probe.

On the other hand, if a working distortion is provided to the plated Ni coating layer, the plated Ni coating layer which little contains hydrogen and so forth therein will be obtained due to the facts that the pinholes in the coating layer are crushed to disappear and that hydrogen or remaining air which has been occluded in the plated Ni coating layer is discharged due to working heat, for example, upon wire drawing. It is considered that, as a result, such bad influences of hydrogen and so forth described above can be eliminated. It is to be noted that formation of a working distortion on the plated Ni coating layer can be realized, for example, by performing, in a process of production of a very thin metal wire, Ni plating in advance before a strand is worked by cold wire drawing and then performing wire drawing, that is, plastic working, of the strand.

With the inspection probe, since a plated Ni coating layer is formed on the surface of the very thin metal wire, the activity of the metal wire when it is worked into a very thin wire can be suppressed while a self lubricating property in shaping is achieved and a corrosion resisting property conforming to reduction in diameter is obtained so that occurrence of corrosion can be prevented. Further, since a working distortion is provided to the plated Ni coating layer, a possible bad influence of hydrogen or residual air can be eliminated.

Preferably, the very thin metal wire has a diameter of 50 μm or less, and the inspection probe may be embedded at a pitch of 50 μm or less in a base made of a resin material so as to allow a plurality of such inspection probes to be arranged parallelly in a spaced relationship by a distance equal to or less than 50 μm on the base such that either ends or intermediate bent portions of such inspection probes are exposed outside from the base. The inspection probe may be incorporated in a probe pin head for the inspection of an electronic circuit board.

The resin material of the base may preferably be selected from among thermoplastic resins such as polyether resins, ether-ketone resins and polycarbonate resins so as to facilitate working when the base is bent thereby to form the intermediate portions of the inspection probes.

Since the inspection probe is embedded at the very thin metal wire thereof in the resin base, the strength and rigidity where the very thin metal wire having a diameter of 50 μm or less is adopted as a probe pin are assured by such integration of the inspection probe with the resin base, and necessary strength and rigidity can be assured by suitably setting the thickness of the resin base.

With the inspection probe, since the very thin metal wire having a diameter of 50 μm or less is embedded in the resin base and is shaped so as to have self resiliency as described above, the necessary strength and rigidity when it is employed as a probe pin can be assured, and besides the pitch of such inspection probes where a plurality of such inspection probes are disposed parallelly to each other can be reduced remarkably to 50 μm or less. Consequently, the inspection probe can cope with a high density of objects for the inspection. Accordingly, for example, a probe pin head in which a plurality of such inspection probes are incorporated can cope with an increase of the number of picture elements, for example, of a liquid crystal substrate and also can cope with a decrease of the pitch of objects for the inspection, for example, of a semiconductor logic device.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENTS

Figure 1:
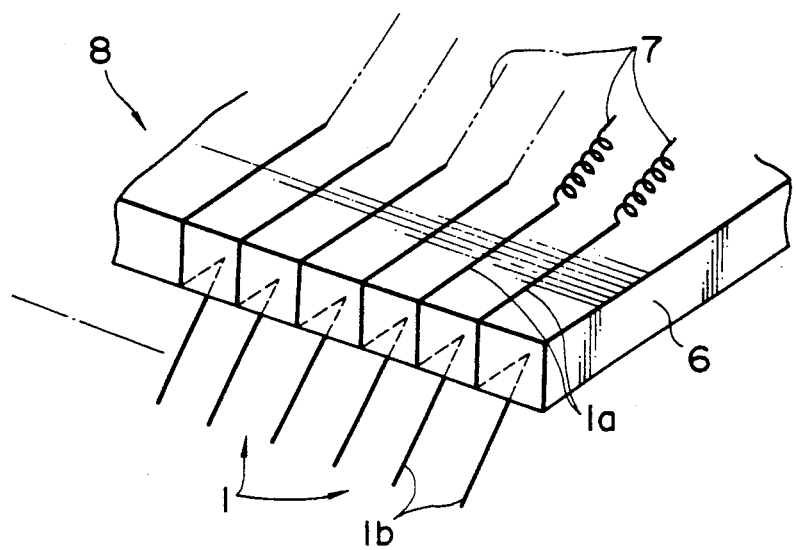
FIG. 1 is a partial perspective view of a probe pin head in which an inspection probe to which the present invention is applied is incorporated.
Figure 2:
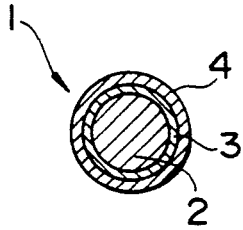
FIG. 2 is a sectional view of the inspection probe shown in FIG. 1.
Figure 3:
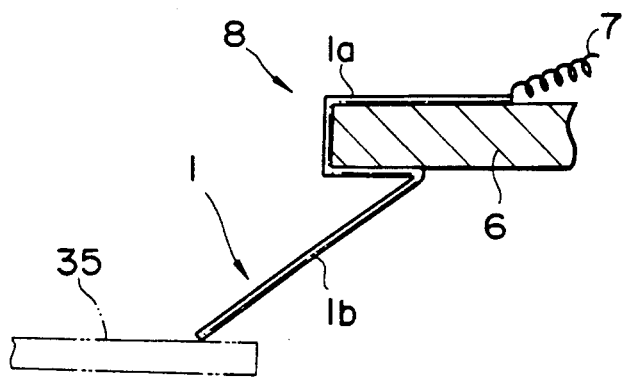
FIG. 3 is a side elevational view of the probe pin head of FIG. 1.

Referring first FIGS. 1 to 3, there is shown a probe pin head in which an inspection probe according to the present invention is incorporated. The probe pin head is suitable for use for the inspection of conduction of conductors on a liquid crystal substrate.

The probe pin head generally denoted at 8 includes a plurality of inspection probes 1 disposed parallelly in a predetermined spaced relationship from each other on a base 6 in the form of a rectangular plate made of a resin material. Referring particularly to FIG. 2, each of the inspection probes 1 is composed of a low carbon two-phase structure steel wire 2 having a diameter of 120 μm or less, a plated Ni coating layer 3 formed as a foundation on a surface of the steel wire 2, and a plated noble metal layer 4 formed as a coating on a surface of the coating layer 3 as the foundation. Each of the inspection probes 1 has a mounting portion 1a bent in a channel-shape in side elevation and a contacting portion 1b contiguous to the mounting portion 1a and extending obliquely downwardly from the resin base 6. Thus, each of the inspection probes 1 is so shaped as to have self resiliency. The mounting portions 1a of the inspection probes 1 are fitted on surfaces of the base 6 along an end of the base 6 to secure the inspection probes 1 at a predetermined pitch to the base 6. It is to be noted that the pitch of the inspection probes 1 of the probe pin head 8 coincides with the pitch of conductors of a liquid crystal substrate 35 to be inspected by the probe pin head 8. Further, a lead wire 7 is connected at an end thereof to an end portion of the mounting portion 1b of each of the inspection probes 1, and the other ends of the lead wires 7 are connected to a measuring instrument not shown.

Such inspection probes 1 are produced in the following manner. In particular, a strand made of such low carbon two-phase structure steel as described above is first plated with Ni and is then drawn into a wire of a predetermined wire diameter, whereafter it is shaped into such specific shape having self resiliency as described above and then a plated noble metal layer is formed on the wire, and finally, annealing is performed for the wire to remove distortion from the wire. Here, the low carbon two-phase structure steel wire 2 is produced by compulsorily working a wire stock consisting of 0.01 to 0.50% by weight of C, less than 3.0% by weight of Si, less than 5.0% by weight of Mn and the remaining part of Fe and inevitable impurities and having a wire diameter of 3.0 to 6.0 mm to obtain a wire of a diameter of 10 to 120 μm by primary thermal treatment, primary cold wire drawing, secondary heat treatment and secondary cold wire drawing. The very thin steel wire 2 has fiber-like fine metal structures wherein working cells produced by the compulsory working mentioned above are arranged to extend in one direction like fibers. Besides, the size and the fiber to fiber distance of the steel wire 2 range from 5 to 100 Å and 50 to 1,000 Å, respectively, and the tensile strength of the steel wire 2 ranges from 300 to 600 kgf/mm$^2$.

Meanwhile, the plated Ni coating layer 3 has a working distortion caused by plastic working when the wire stock is cold drawn into a wire. In particular, the plated Ni coating layer 3 is produced such that plating is performed for a wire stock at a step preceding to wire drawing to form a coating layer of 4 μm or so and then the wire stock is cold wire drawn primarily and secondarily so as to have a thickness of 1 μm or so. Consequently, pinholes produced upon plating are crushed upon such wire drawing, and the coating layer thus produced is free from defects such as hydrogen or residual air.

After such wire drawing, the wire is shaped so as to have such self resiliency as described above, and in order to reduce a plane distortion upon such shaping, it is important to raise the staightness upon such wire drawing as high as possible.

When the probe pin head 8 is used to inspect conduction, for example, of conductors on a liquid crystal substrate 35, the contacting portions 1b of the inspection probes 1 thereof are contacted with the conductors on the liquid crystal substrate 35. In this instance, a possible dispersion in extent over which the contacting portions 1b of the inspection probes 1 are projected from the resin base 6 is absorbed because the contacting portions 1b are resiliently deformed in the contacting direction by their self resiliency, and consequently, the contacting portions 1b are contacted simultaneously and uniformly with all of the conductors. Accordingly, a stabilized inspecting performance can be obtained with the probe pin head 8.

With the inspection probe 1 of the present embodiment, since it has self resiliency due to the mounting portion 1a and contacting portion 1b thereof, an accommodating case, a coil spring and so forth which are required in such conventional inspection probe is unnecessary, and accordingly, such inspection probes 1 can be disposed closely with each other as much. Meanwhile, since the low carbon two-phase structure carbon wire 2 of each inspection probe 1 is small in plane distortion in a shaped condition, even if it is disposed closely with an adjacent inspection probe 1, possible interference by a bend of either inspection probe 1 is prevented and the distances between adjacent probes 1 can be made uniform. Further, since the low carbon two-phase structure steel wire 2 has a very high strength at a tensile strength of 300 to 600 kg/mm$^2$ with a wire diameter 120 $\mu$m or less and besides has a significantly high durability and tenacity, further reduction in diameter of the inspection probe 1 can be realized while the available minimum diameter of a conventional inspection probe is 150 $\mu$m. As a result, the pitch of the inspection probes 1 of the probe pin head 8 can be uniformed and can be reduced extremely, and a conduction inspection which copes with a high density of picture elements of such liquid crystal substrate 35 in recent years is made available.

Generally, where the required number of picture elements is 800 thousands, the required pitch of inspection probes which are disposed by a quantity of 3,000 to 9,000 is 150 $\mu$m or so, but with the inspection probes 1 of the present embodiment, the specific pitch can be realized by making the wire diameter equal to 100 $\mu$m. Meanwhile, in the case of 3 million picture elements, the required pitch is 80 $\mu$m or so, but with the probes 1 of the present embodiment, it can be realized by making the wire diameter equal to 50 $\mu$m. According to the present invention, if the wire diameter described above is made further finer, for example, to 20 $\mu$m, then the inspection probes 1 can cope with the pitch of 25 $\mu$m which is required for a semiconductor logic device.

Meanwhile, in the present embodiment, since the plated Ni coating layer 3 is formed on the low carbon two-phase structure steel wire 2 and further a working distortion is provided to the plated Ni coating layer 3 by plastic working upon wire drawing, the plated Ni coating layer 3 has a layer structure free from such defects as pinholes and little contains hydrogen or remaining air therein. Accordingly, a bad influence upon the strand of the inspection probe 1 can be eliminated and the activity of the very thin wire of the inspection probe 1 can be suppressed. Even if heat is generated by friction or the like, burning or disconnection of the very thin wire can be prevented and provision of self lubrication and corrosion resistance is improved.

It is to be noted that, while the inspection probe in the embodiment described above is applied for the inspection of a liquid crystal substrate, the application of an inspection probe of the present invention is not limited to this, and it can be applied for the inspection of conduction of a wire pattern formed on a semiconductor substrate. In summary, an inspection probe of the present invention can be applied for the inspection of conduction of contacts disposed in a high density on an electronic circuit board.

Also, while a low carbon two-phase structure steel wire is adopted for the very thin metal wire in the embodiment described above, the present invention may otherwise adopt a piano wire or a stainless steel wire, and also in this instance, similar effects to those of the embodiment described above can be attained.

Further, while the plated Ni coating layer is formed as a foundation on the very thin metal wire in the embodiment described hereinabove, the very thin wire need not necessarily have a plated Ni coating layer formed thereon.

Figure 4:
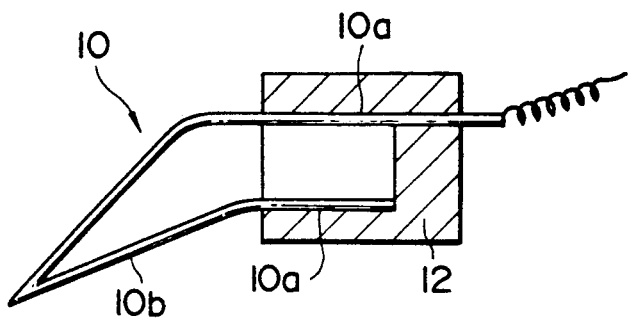
FIG. 4 is a side elevational view of another probe pin head in which another inspection probe to which the present invention is applied is incorporated.

Referring now to FIG. 4, there is shown in side elevation another probe pin head in which another inspection probe to which the present invention is applied is incorporated. The inspection probe denoted at 10 is constituted such that a central portion thereof is bent at an acute angle to form a folded contacting portion 10b having a bill-like side elevation. The opposite end portions 10a of the contacting portion 10b of the inspection probe 10 are inserted in and secured to a base 12. In the case of the present embodiment, similar effects to those of the embodiment described above are obtained, and the inspection probe of the present embodiment is particularly effective where the wire diameter is further smaller at ten and several $\mu$m.

Figure 5:
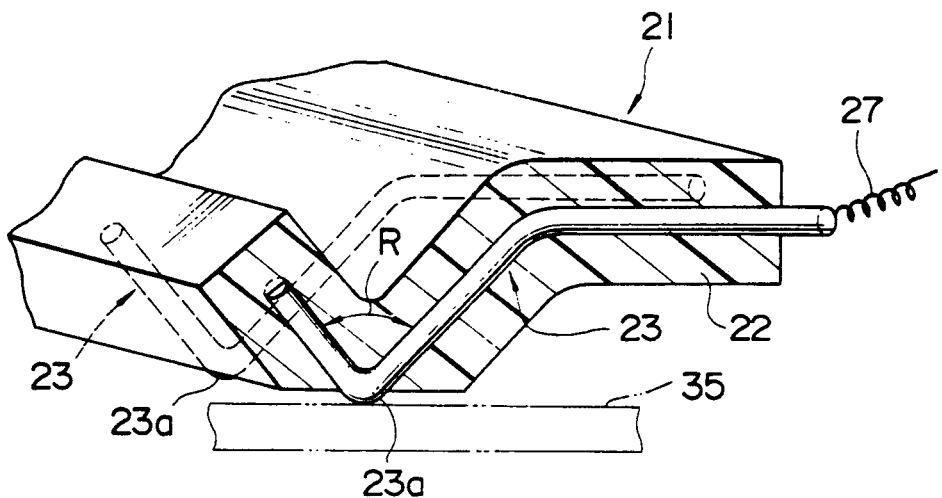
FIG. 5 is a perspective view, partly in section, of a further probe pin head in which a further inspection probe to which the present invention is applied is incorporated.

Referring now to FIG. 5, there is shown a further probe pinhead to which a further inspection probe to which the present invention is applied is incorporated. The probe pin head generally denoted at 21 includes a plurality of inspection probes 23 embedded parallelly in a predetermined spaced relationship from each other in a base 22 in the form of a rectangular plate made of a resin material. Each of the inspection probes 23 has a diameter of 50 $\mu$m or less and has the same construction as the inspection probes 1 of the first embodiment described hereinabove with reference to FIG. 2. However, the inspection probes 23 have a different shape in side elevation from that of the inspection probes 1, and also the base 22 of the probe pin head 21 has a different shape from the base 6 of the probe pin head 8 described hereinabove with reference to FIGS. 1 and 3. In particular, a front portion of the base 22 is bent into a V-shape in side elevation and a bottom portion of the V-shape thereof is horizontally cut as seen in FIG. 5 so that the base 22 may have self resiliency. Such V-shape continues in a direction in which the inspection probes 23 are disposed in a row. Each of the inspection probes 23 is also bent into a V-shape, and the angularly bent corner portion thereof is exposed outside from the bottom of the V-shape of the base 22 as seen in FIG. 5 so that it may serve as an inspection contact 23a for contacting with an object or conductor for the inspection. The bent angle R of such inspection contact 23a is suitably set in accordance with a pitch of the inspection probes 23 embedded in the base 22, but preferably it should be made as small as possible. A lead wire 27 is connected to an end of each of the inspection probes 23, and the other ends of the lead wires 27 are connected to a measuring instrument not shown.

The probe pin head 21 is produced in the following procedure.

Figure 6A:
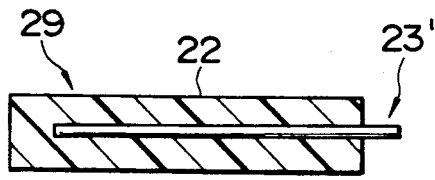
FIGS. 6a and 6b are sectional views illustrating different stages of production of the probe pin head shown in FIG. 5.

First, a predetermined number of probe pins 23' in a straight condition before they are bent are disposed at a predetermined pitch. Then, thermoplastic resin material is poured into a spacing in which the probe pins 23' are disposed such that only one end portions of the probe pins 23' may be projected from the spacing, thereby forming a composite member 29 consisting of the probe pins 23' and the base 2 as seen in FIG. 6a.

Figure 6B:
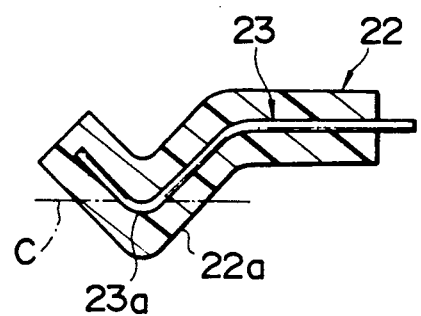
Figure 7:
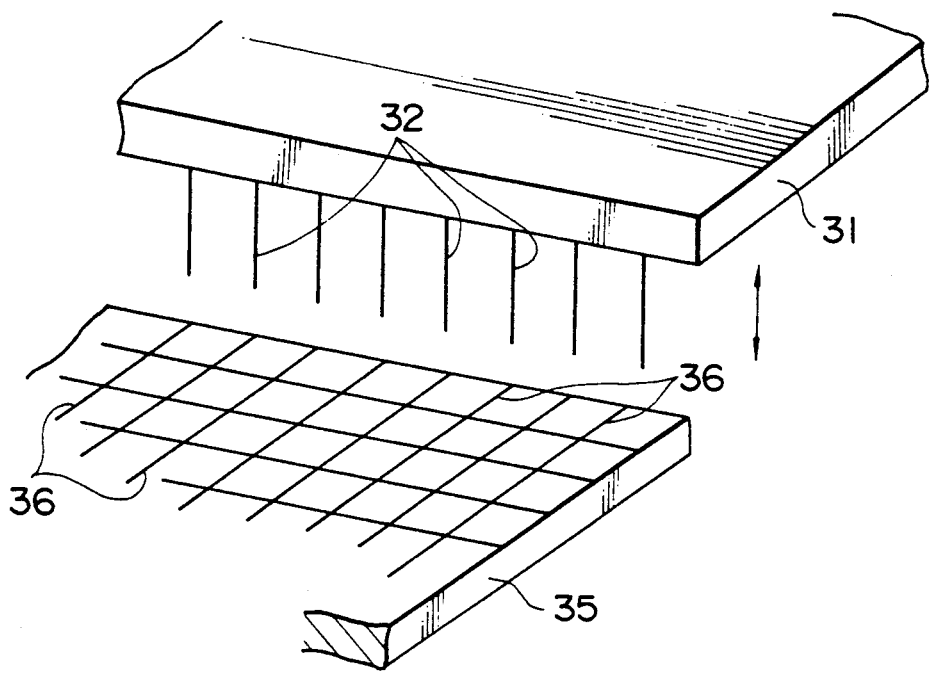
FIG. 7 is a fragmentary perspective view of a conventional probe pin head.
Figure 8:
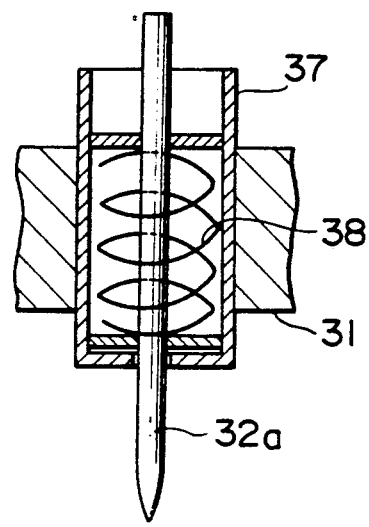
FIG. 8 is an enlarged sectional view of a conventional inspection probe incorporated in the conventional probe pin head shown in FIG. 7.

Subsequently, the composite member 29 is heated and then a front portion of the composite member 29 is bent into a V-shape along the direction in which the probe pins 23' are arranged as seen in FIG. 6b. After the composite member 29 becomes cool, a bent portion 22a of the base 22 is cut away along a cutting line C indicated in FIG. 6b to expose inspection contacts 23a of the inspection probes 23 outside from the base 22, thereby completing the probe pin head 21 shown in FIG. 5. It is to be noted that the inspection contacts 23a of the inspection probes 23 may otherwise be exposed such that, when the probe pins 23' are embedded into resin material, such inspection contacting portions may not be covered by but may be exposed outside from the resin material.

With the probe pin head 21 described above, since the inspection probes 23 are embedded in the resin base 22, the strength and rigidity of the inspection probes 23 against a contacting pressure with an object for the inspection can be assured even where very thin metal wires having a diameter of 50 μm or less are adopted for the inspection probes 23.

Further, since the inspection probes 23 are so shaped as to have self resiliency together with the base 22, an accommodating case, a coil spring and so forth which are required for a conventional inspection probe as described hereinabove can be eliminated, and accordingly, the inspection probes 23 can be disposed closely with each other as much and can cope with reduction of the pitch thereof. Further, since the inspection probes 23 have the similar construction to the inspection probes 1 of the first embodiment described hereinabove, similar effects can naturally be anticipated.

Further, according to the process of production described above, since a predetermined number of straight probe pins 23' disposed at a predetermined pitch are embedded into resin material to form a composite member 10 and then the composite member 10 is bent into a V-shape to provide self resiliency to the same, such probe pin head can be produced in a mass and the accuracy in dimension is improved.

Having now fully described the invention, it will be apparent to one of ordinary skill in the art that many changes and modifications can be made thereto without departing from the spirit and scope of the invention as set forth herein.

What is claimed is:

1. An inspection probe comprising:
   a base; and
   a plurality of thin metal wires having mounting portions mounted to said base, each of said wires having a diameter of no more than 120 μm, being formed from a low carbon two-phase structure steel having a tensile strength of 300 kg/mm$^2$ and being plated with a noble metal layer, each of said wires further having a contacting portion shaped to have self resiliency and being oriented such that said contacting portion may freely bend in a direction perpendicular to the axis of the contacting portion.

2. An inspection probe according to claim 1, wherein a plated Ni coating layer is formed as a foundation for said plated noble metal layer on the surface of said thin metal wire, and said coating layer has working distortion caused by plastic working.

3. An inspection probe according to claim 1, wherein said thin metal wire has a diameter of 50 μm or less.

4. An inspection probe according to claim 3, wherein said thin metal wires are embedded in said base at spacings of 50 μm or less such that one of ends and intermediate bent portions of thin metal wires are exposed outside of said base, wherein said base is made of a resin material.

* * * * *